(12) United States Patent
Arp et al.

(10) Patent No.: US 10,148,259 B1
(45) Date of Patent: Dec. 4, 2018

(54) SKEW SENSOR WITH ENHANCED RELIABILITY

(71) Applicant: INTERNATIONAL BUSINESS MACHINES CORPORATION, Armonk, NY (US)

(72) Inventors: Andreas H. A. Arp, Nufringen (DE); Fatih Cilek, Boeblingen (DE); Michael V. Koch, Ehningen (DE); Matthias Ringe, Tuebingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/793,269

(22) Filed: Oct. 25, 2017

Related U.S. Application Data

(63) Continuation of application No. 15/720,460, filed on Sep. 29, 2017.

(51) Int. Cl.
*G06F 1/10* (2006.01)
*H04L 25/14* (2006.01)
*H03K 5/15* (2006.01)
*H03K 5/00* (2006.01)

(52) U.S. Cl.
CPC ............ *H03K 5/15006* (2013.01); *H03K 2005/00058* (2013.01)

(58) Field of Classification Search
USPC ................ 327/145; 713/401, 503; 716/104
See application file for complete search history.

(56) References Cited

U.S. PATENT DOCUMENTS

| | | | | |
|---|---|---|---|---|
| 5,691,656 A | * | 11/1997 | Sandusky | G01R 25/00 327/12 |
| 5,828,870 A | * | 10/1998 | Gunadisastra | G06F 1/10 713/503 |
| 6,622,255 B1 | * | 9/2003 | Kurd | G06F 1/10 713/401 |
| 7,143,303 B2 | * | 11/2006 | Sohn | G06F 1/10 713/503 |

(Continued)

OTHER PUBLICATIONS

IBM: List of IBM Patents or Patent Applications Treated as Related (Appendix P), Nov. 2, 2017 pp. 1-2.

(Continued)

*Primary Examiner* — Adam Houston
(74) *Attorney, Agent, or Firm* — Steven Meyers; Michael A. Petrocelli

(57) ABSTRACT

A skew control loop circuit for controlling a skew between a plurality of digital signals, and a semiconductor device, and a method of operation, for the same, may be provided. The skew control loop circuit comprises a skew detector for detecting a phase difference between the digital signals, a skew control circuit adapted for controlling an operation of the skew control loop circuit. The skew control circuit is operable in a first operating mode and in a second operating mode. The skew control loop circuit comprises also an enable input of the skew detector, wherein the enable input is adapted for receiving an enable input signal, generated by the skew control circuit, wherein the enable input is adapted for selectively enable or disable a phase detection operation of the skew detector, and wherein the enable input signal is only active during the first operating mode.

8 Claims, 5 Drawing Sheets

(56) References Cited

U.S. PATENT DOCUMENTS

| | | | | |
|---|---|---|---|---|
| 7,421,606 | B2* | 9/2008 | Kim | H03L 7/085 |
| | | | | 327/141 |
| 7,770,049 | B1* | 8/2010 | Searles | G06F 1/10 |
| | | | | 713/401 |
| 8,887,110 | B1* | 11/2014 | Zlatanovici | G06F 17/505 |
| | | | | 716/104 |
| 9,337,993 | B1* | 5/2016 | Lugthart | H04L 7/033 |
| 2002/0172304 | A1* | 11/2002 | Saze | G11C 7/1078 |
| | | | | 375/340 |
| 2006/0253821 | A1* | 11/2006 | Kitahara | G06F 17/505 |
| | | | | 326/93 |
| 2008/0005518 | A1* | 1/2008 | Gillingham | G06F 13/4243 |
| | | | | 711/167 |
| 2016/0134267 | A1* | 5/2016 | Adachi | H03K 5/159 |
| | | | | 327/237 |
| 2016/0161977 | A1* | 6/2016 | Kim | G06F 13/1689 |
| | | | | 713/503 |
| 2017/0097655 | A1* | 4/2017 | Jeon | G06F 1/12 |
| 2017/0279441 | A1* | 9/2017 | Adachi | H03K 5/1565 |

OTHER PUBLICATIONS

Geannopoulos et al., "An Adaptive Digital Deskewing Circuit for Clock Distribution Networks", ISSCC98 / Session 25 / Clock Networks / Paper SP 25.3, Feb. 7, 1998, pp. 400-401.

Pending U.S. Appl. No. 15/720,460, filed Sep. 29, 2017, entitled: "Skew Sensor With Enhanced Reliability", pp. 1-22.

\* cited by examiner

SKEW SENSOR WITH ENHANCED RELIABILITY

FIELD OF THE INVENTION

The invention relates generally to a skew control circuit, and more specifically, to a skew control loop circuit for controlling a skew between a plurality of digital signals. The invention relates further to a semiconductor comprising the skew control loop circuit and a method for operating the skew control loop circuit.

BACKGROUND

Designing digital circuitry requires a clear design of signal timing and the right sequence of signals dependent from each other. Special focus is often on investigating timing behavior, especially, on wave forms of critical signals, like, clock signals. In complex chip designs clock signals run across multiple clock trees and clock meshes to different physical areas of a semiconductor die. In particular, rising and falling edges of signals require special attention. Displaying this time behavior of these critical signals on and in integrated circuits is paramount for the functionality and reliability of VLSI (very large-scale integrated circuit) chips. Besides the signal waveform in general, the slew rate is a relevant figure of merit and has to be monitored and potentially adapted for meeting design requirements. One of the caveats is that the measurement is required to be made on-chip because of the risk of distortions from the observed signal by external measurement equipment. Therefore, an on-chip signal skew detection is needed.

However, known skew or phase detectors enter a so-called metastable state, i.e., generating zeros and/or ones unpredictably at an output of a flip-flop if the input signals are synchronized. One of the known disadvantages of such a metastable state is that transistor pairs of the flip-flop and following drivers/transistors draw high currents and deteriorate the reliability of the complete system. In order to increase circuit reliability by, e.g., reducing power consumption of large semiconductor chips, it may be desirable to avoid the state of metastability while—at the same time—ensure a high degree of synchronization of distributed clock signals.

SUMMARY

According to one aspect of the present invention, a skew control loop circuit for controlling a skew between a plurality of digital signals may be provided. The skew control loop circuit may comprise a skew detector for detecting a phase difference between the digital signals, signal inputs to the skew detector, the signal input being adapted for inputting the digital signals to the skew detector, and a skew control circuit adapted for controlling an operation of the skew control loop circuit, wherein the skew control circuit may be operable in a first operating mode and in a second operating mode. Furthermore, the skew control loop circuit may comprise an enable input of the skew detector, wherein the enable input may be adapted for receiving an enable input signal generated by the skew control circuit. The enable input may be adapted for selectively enable or disable a phase detection operation of the skew detector, and wherein the enable input signal is only active during the first operating mode.

According to another aspect of the present invention, a semiconductor device comprising the described may be provided. According to one embodiment, a semiconductor device comprising a skew control loop circuit for controlling a skew between a plurality of digital signals may be provided. A semiconductor die includes a circuit, and the circuit comprises: a skew detector for detecting a phase difference between a plurality of digital signals; signal inputs are received by the skew detector, and the signal input is adapted for inputting the digital signals to the skew detector. A skew control circuit is adapted for controlling an operation of the skew control loop circuit, wherein the skew control circuit is operable in a first operating mode and in a second operating mode. An enable input of the skew detector is adapted for receiving an enable input signal generated by the skew control circuit. The enable input is adapted to selectively enable or disable a phase detection operation of the skew detector, and wherein the enable input signal is only active during the first operating mode.

According to a further aspect of the present invention, a method for operating a skew control loop circuit for controlling a skew between a plurality of digital signals may be provided. The skew control loop circuit may comprise detecting a phase difference between the digital signals by a skew detector of a skew control loop circuit, inputting the digital signals to input connections of the skew detector, and controlling an operation of the skew control loop circuit by using a skew control circuit, by operating the skew control circuit in a first operating mode and in a second operating mode.

Furthermore, the method may comprise receiving an enable input signal by the skew detector generated by the skew control circuit, wherein the enable input enables or disables a phase detection operation of the skew detector, and wherein the enable input signal is only active during the first operating mode.

BRIEF DESCRIPTION OF THE SEVERAL VIEWS OF THE DRAWINGS

It should be noted that embodiments of the invention are described with reference to different subject-matters. In particular, some embodiments are described with reference to method type claims, whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above, and further aspects of the present invention, are apparent from the examples of embodiments to be described hereinafter and are explained with reference to the examples of embodiments, but to which the invention is not limited.

Figure 1:
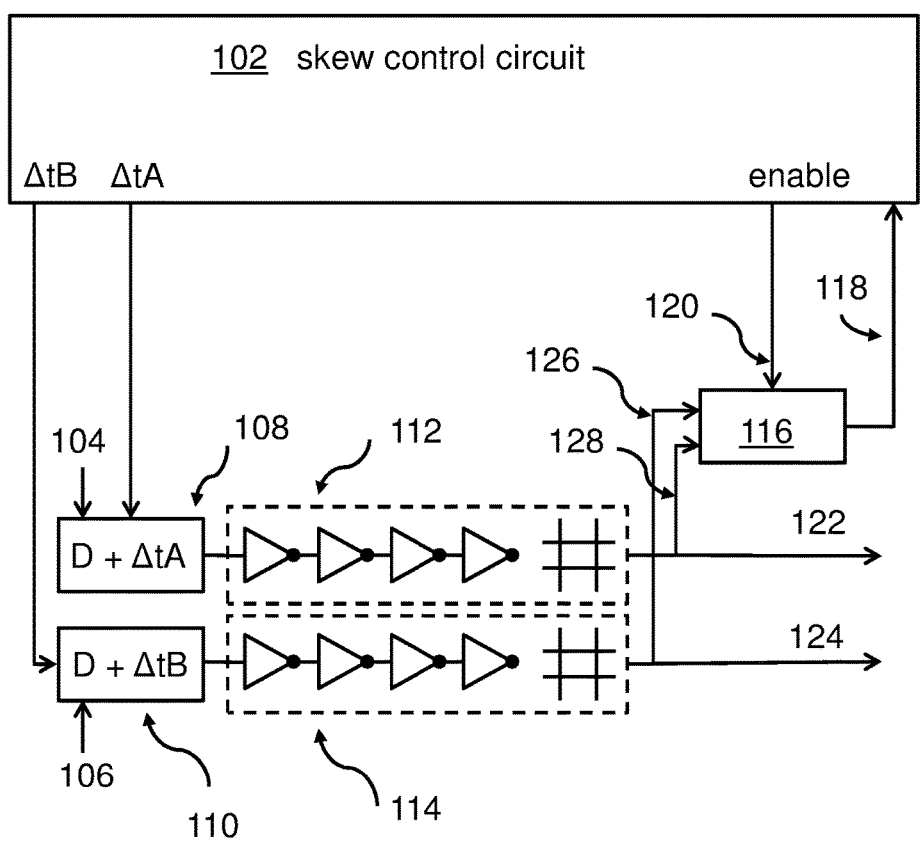

Preferred embodiments of the invention will be described, by way of example only, and with reference to the following drawings:

FIG. 1 shows a block diagram of an embodiment of the inventive skew control loop circuit for controlling a skew between a plurality of digital signals.

Figure 2:
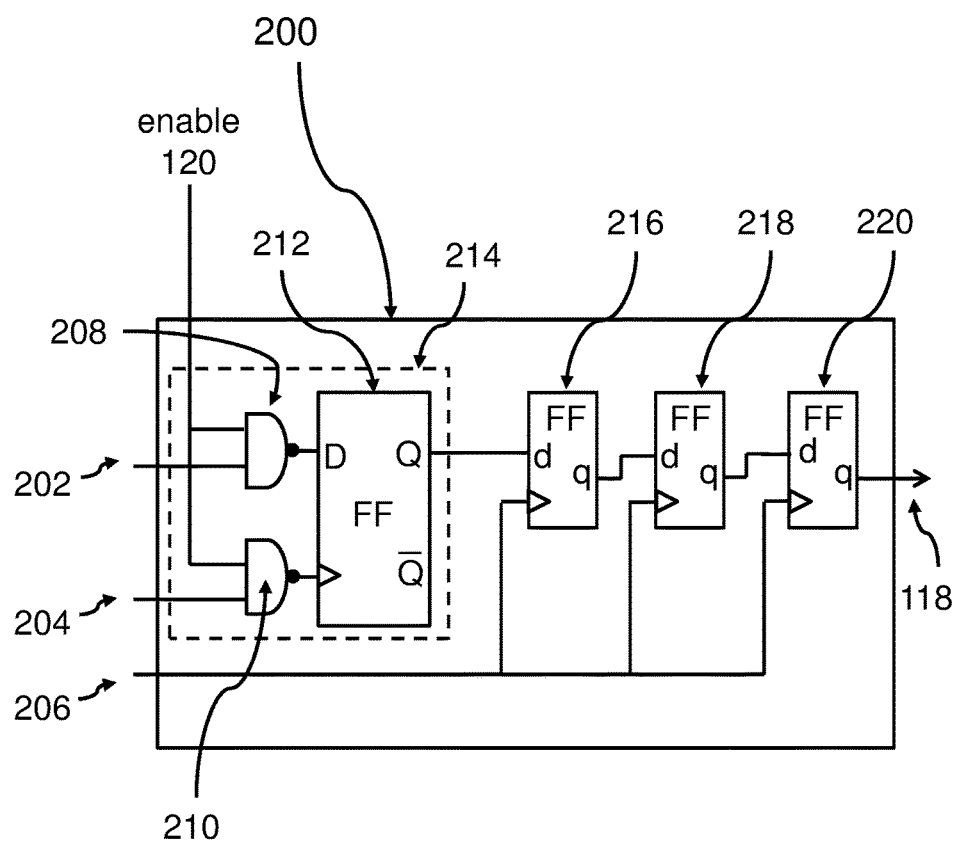

FIG. 2 shows a block diagram of a first embodiment of the related skew detector.

Figure 3:
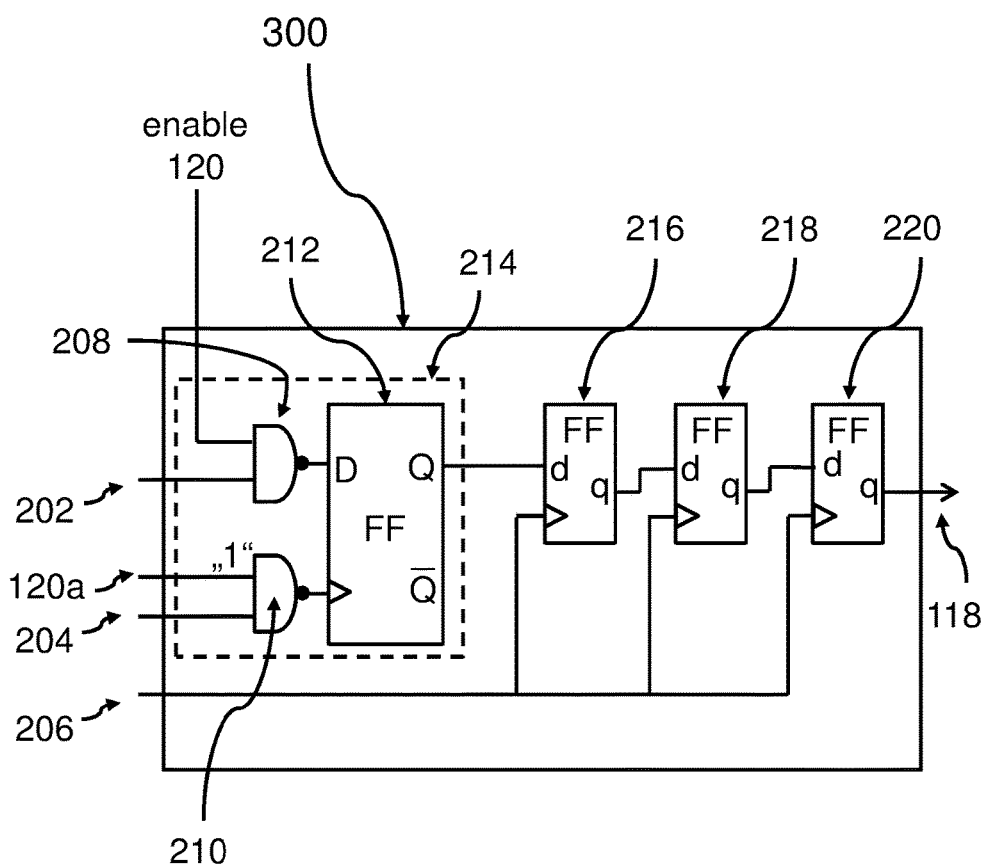

FIG. 3 shows a block diagram of a second embodiment of the related skew detector.

Figure 4:
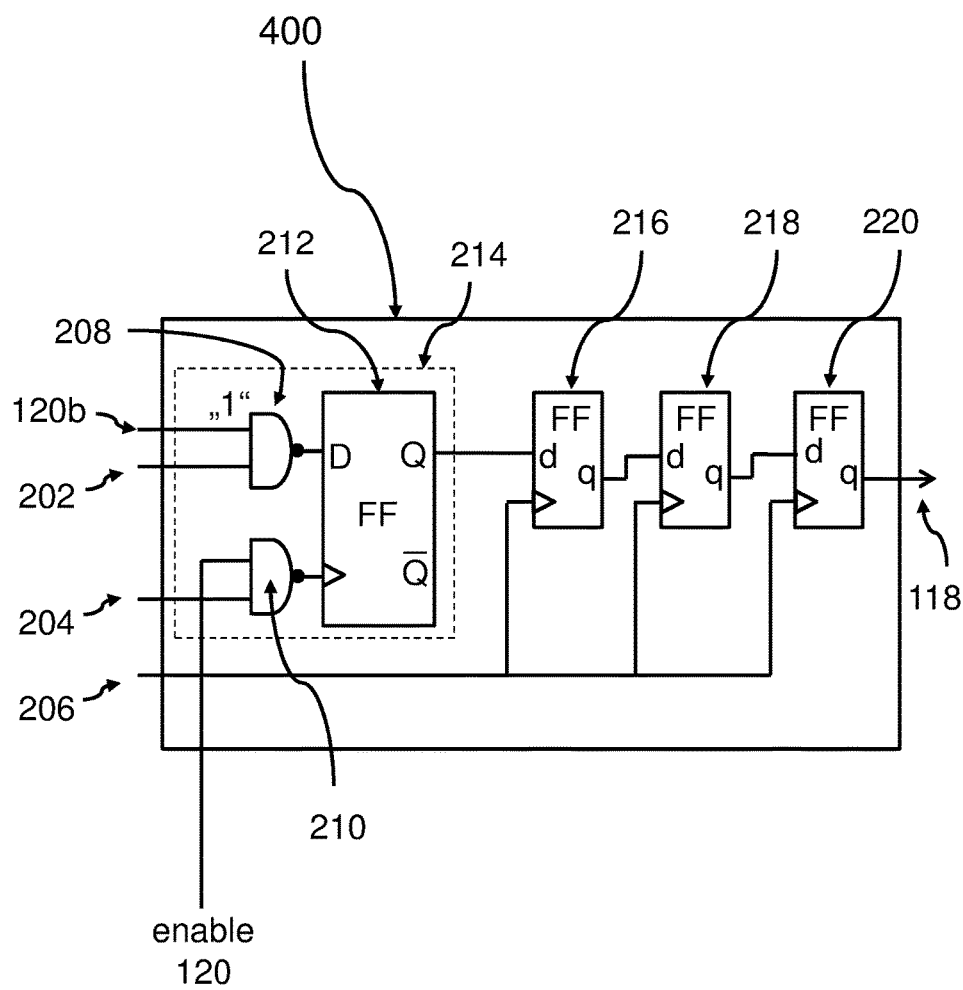

FIG. 4 shows a block diagram of a third embodiment of the related skew detector.

Figure 5:
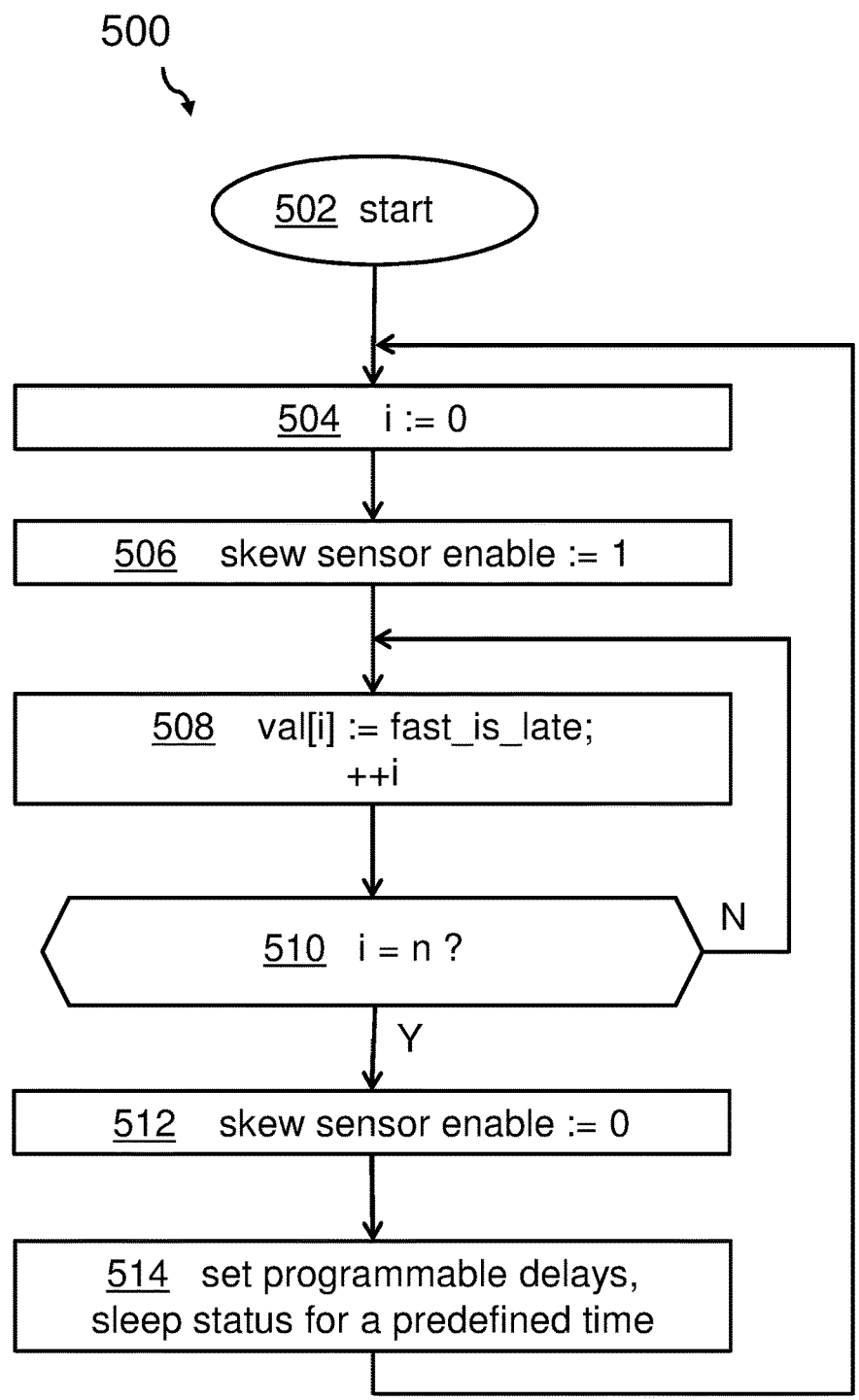

FIG. 5 shows an embodiment of a flow chart illustrating different stages of the operation of the skew control loop circuit.

DETAILED DESCRIPTION

In the context of this description, the following conventions, terms and/or expressions may be used:

The term 'skew control loop circuit' may denote a circuitry in a closed loop manner controlling digital signals, in particular clock signals. A skew may be detected and delays may be applied to the digital signals in order to keep the digital signals synchronized. The related skew detector—also called phase detector—may only be enabled during the measurement phase.

In this sense, the term 'controlling'—in particular, controlling a skew—may denote an adaptation of the timing of the digital signals relative to each other. This may be implemented by applying different delays to one and/or the other of the digital signals.

The term 'skew' may denote a phase difference between digital signals which should be synchronized, but are not, due to different signal runtimes on different paths, e.g., due to different clock trees and/or clock meshes of a semiconductor die.

The term 'digital signals' may generally denote any digital signals measurable on a semiconductor chip. However, in the context of this application, the digital signals may typically be clock signals.

The term 'skew detector' may denote an electronic circuitry adapted for detecting a skew or phase difference between typically synchronized digital signals, i.e., a phase difference between the digital signals may be detected by the skew detector. In some instances, the skew detector may also be denoted as phase detector or skew sensor or phase sensor.

The term 'skew control circuit' may denote an electronic circuitry adapted for receiving an output signal of the skew detector in order to, e.g., generate individual delay signals for delay circuits through which the digital signals run, and to generate an enable signal for the skew detector in order to activate the phase or skew measurement only at selected times.

The term 'first operating mode' may denote an operation mode of the skew control circuit, in which the skew detector is actively detecting a skew between digital signals.

The term 'second operating mode' may denote an operation mode of the skew control circuit (and thus the skew control loop circuit), in which the skew detector is inactive and thus not measuring any skew or phase differences between the digital input signals.

The term 'enable input' may denote a digital signal generated by the skew control circuit in order to activate the skew detector for a measurement of the phase/skew between its related input signals.

The proposed skew control loop circuit for controlling a skew between a plurality of digital signals may offer multiple advantages and technical effects:

Disadvantages of existing phase or skew sensors may be overcome. It is known that skew detectors may enter a metastable state if the two input signals are actually synchronized. However, such permanent switching (metastable) may result in the disadvantage of relatively high power consumption. The here proposed solution may avoid the metastable state of the skew detector in a closed loop environment by enabling an active skew measurement only if required. A related skew control circuit may during other time periods—not used for the phase measurement—calculate and generate individual delay values to influence the behavior of the different digital signals in order to synchronize them again, do anything else, or simply wait.

Thus, the skew detector is only active during actual skew measurement times. During the remaining time periods the functionality of the skew detector may be switched off and/or blocked so that a metastable state of involved flip-flops may not happen.

In the following, a plurality of additional embodiments will be described:

According to one advantageous embodiment of the skew control loop circuit, the skew detector may comprise circuitry—e.g. a gate enabled D flip-flop—operable for preventing a phase detection circuit of the skew detector from entering a metastable state while the first operating mode is disabled. Thus, only in times of measurement of a potential phase difference between the digital signals, the skew detector may be active, potentially outputting mixed or different ones and zeros. Thus, the metastable state may only be detectable during the small time period of active measurement during a predefined number of cycles.

According to one preferred embodiment of the skew control loop circuit, the skew control loop circuit may comprise at least one gating circuit operable for gating at least one of the digital signals. The gating circuit—in particular a NAND gate—may be arranged between at least one of the signal inputs and the skew detection circuit. Other gating mechanisms are possible, e.g., OR gates with inverters, etc.

According to one permissive embodiment of the skew control loop circuit the skew detector comprises a flip-flop, in particular a D flip-flop. This may build the core skew detector of the skew detector. Other D flip-flops may follow the first D flip-flop in series.

According to another advantageous embodiment of the skew control loop circuit the phase difference between the plurality of digital signals may be detected over a predefined set of cycles. Useful values for the predefined set of cycles may be eight cycles or more, typical 16 cycles. However, also other numbers of cycles may be possible, e.g., 4, 32, . . . However, the number of cycles is not limited to a number according to a power of 2, but any integer number, e.g., 7, 13, 27 or the like, is possible. This allows a wide range of design flexibility.

According to one additionally preferred embodiment of the skew control loop circuit a determination of being in the metastable state is based on a predefined number of alternative states. It may be defined that only one alternative state to the majority of states in a predefined set of cycles determines already metastability. However, also other predefined numbers of alternative states in a predefined set of cycles may be used to define metastability. This may allow a fine-tuned operation of the skew control loop circuit according to design requirements.

According to one permissive embodiment of the skew control loop circuit the digital signals are clock signals, in particular misaligned clock signals. However, the inventive concept may be applied to any other digital signals which should typically be "in synch", but which may be not due to non-perfect electronic circuits.

In the following, a detailed description of the figures will be given. All instructions in the figures are schematic. Firstly, a block diagram of an embodiment of the inventive skew control loop circuit for controlling a skew between a plurality of digital signals is given. Afterwards, further embodiments, as well as embodiments of the method for operating a skew control loop circuit for controlling a skew between a plurality of digital signals, will be described.

FIG. 1 shows a block diagram of an embodiment of the inventive skew control loop circuit 100 for controlling a skew between a plurality of digital signals 104, 106. These digital input signals 104, 106 may, e.g., be clock input signals in a complex semiconductor circuit. They may individually run through delay circuits 108, 110 in which a base delay D plus a delta value ΔtA, ΔtB may be applied before the signals run through clock trees and clock meshes 112, 114, symbolized by the two series of inverters/drivers and double crosses for the clock meshes. As discussed above, it may be important that the two signals in different parts of the clock tree/clock mesh(es) 112, 114 are synchronized. Therefore, these signals are fed to a skew detector 116. Hence, these digital signals 126, 128 are used as input signals for the skew detector 116.

The skew control loop circuit 100 comprises further a skew control circuit 102 adapted for controlling an operation of the skew control loop circuit 100, wherein the skew control circuit 102 is operable in a first operating mode and in a second operating mode. The skew control circuit 102 is also adapted to generate an enable signal 120 which is used to enable the operation of the skew detector 116. Only when receiving the enable signal 120, the skew detector 116 becomes active to detect the phase difference between the digital input signals 126, 128. Thus, the enable input 120 is adapted for selectively enable or disable a phase detection operation of the skew detector 116. The enable input signal 120 is only active during the first operating mode, i.e., during an actual measurement of a phase difference.

Once a phase difference has been detected, indicated by signal line 118 from the skew detector 116 to the skew control circuit 102, individual delays ΔtA, ΔtB may be generated by the skew control unit 102 in order to influence the operation of the delay circuits 108, 110 in a closed loop process such that the signals in the clock trees/clock meshes 112, 114 are synchronized and available as output signals 122, 124.

It may be noted that a skew detection may also be performed for three or more clock signals. In such an embodiment, one or more additional delay circuits may be required. In case of three clock signals to be compared in their phase, a first skew detector may determine a skew between a first and a second clock signal, and a second skew detector may determine a skew between the second and a third clock signal. The skew detectors may be active (enabled) at different times.

FIG. 2 shows a block diagram of a first embodiment of the related skew detector 200 in more detail. The core skew detector 214 comprises a D flip-flop 212 which input lines are connected to output lines of NAND gates 208, 210. Input line 202 to the NAND gate 208 corresponds to the input line 126 to the skew detector 116 of FIG. 1. Correspondingly, input line 204 to NAND gate 210 corresponds to the input line 128 to the skew detector 116 of FIG. 1. Additionally, the NAND gates 208, 210 each comprise also another input signal 120 which represents the enable signal 120 of the skew detector 116 of FIG. 1. Thus, unless the enable signal 120 is activated, the core skew detector 214 does not detect any changes in the phase of the input signals 202, 204. Line 206 represents a clock signal for the complete skew detector 200.

Additional elements of the first embodiment of the skew detector 200 comprise D flip-flops 216, 218, 220 connected in series, as shown. The output signal 118 of the third D flip-flop 220 is identical to the output signal 118 of the skew detector 116 of FIG. 1, which is used as input signal to the skew control circuit 102.

Thus, whenever the skew control circuit 102 is going to take skew input from the skew detector 116 into account, it will enable the skew detector 116, but only as long as necessary. This way, the amount of time, the skew detector 116 is potentially in a metastable state, will be reduced to a minimum amount of time, and the reliability and lifetime of the skew detector 116 will improved.

FIG. 3 shows a block diagram of a second embodiment 300 of the related skew detector. Here, the enable input 120 is only connected to the NAND gate 208. The related enable input 120a to NAND 210 is connected to logical "1". The remaining parts of this embodiment 300 remain unchanged if compared to FIG. 2.

FIG. 4 shows a block diagram of a third embodiment 400 the related phase controller. Here, the enable input signal 120 is connected to the NAND gate 210, whereas the corresponding input 120b to NAND gate 208 is connected to logical "1". Thus, in both cases of FIG. 3 and FIG. 4, the core skew detector 214 can only be active if the enable signal 120 is active.

FIG. 5 shows an embodiment of a flow chart 500 illustrating different stages of the operation of the skew control loop circuit. To differentiate the two input signals 126, 128, they may be named fast_clock and slow_clock. The control loop may also be seen as a finite state machine that may take some tens or some hundreds of cycles for its operation (e.g., determine the state of change to delay circuits, wait prior to measure a phase difference of clock signals again, etc.). Detecting a phase difference during that period of time may provide no benefits. Therefore, it may be advantageous to turn off the skew detector, save power and enhance the reliability whenever possible. The related algorithm executed by the described circuitry is shown in FIG. 5.

The process starts at 502. Initially, a variable i is set to zero (compare 504). The variable "skew sensor enable" or simply "enable" is set to 1 (compare 506). The then starting inner loop—comprising elements 508, 510—samples n skew detector values called "fast_is_late" (in the sense of the above explained differentiation) in an array called val[i]. This array is being used to determine, if zero skew has been reached. In that case, the array val[i] comprises zeros and ones, e.g. "00101100" or any other combination. In other cases—if no synchronization of the two clock signals is reached—one clock signal is behind the other. In this case, val[i] comprises only zeros, e.g. "00000000" or only ones "11111111", respectively.

If i has reached the predefined number of cycles n—case "y" at 510—the variable "skew sensor enable" is set to zero (compare 512), i.e., the skew detector is disabled again.

Then, programmable delay ΔtA, ΔtB may be set accordingly (depending on the determined skew) by the skew controller circuit 102, FIG. 1. Additionally, the skew detector 116 is set into a sleep status for a predefined amount of time (compare 514), i.e., the enable signal 120 of the skew detector 116 continues to be turned off (compare FIG. 1).

As described, the enable signal 120 for the skew detector is enabled as long as a skew detection is performed for the complete set of n array values. In an alternative implementation, it may also be possible to enable the skew detector 116 only during the time of a detection of one single value.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The flowcharts and/or block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A method for operating a skew control loop circuit for controlling a skew between a plurality of digital signals, comprising:
   inputting digital signals to input connections of a skew detector of a skew control loop circuit;
   detecting a phase difference between said digital signals by said skew detector;
   controlling an operation of said skew control loop circuit by using a skew control circuit, by operating said skew control circuit in a first operating mode and in a second operating mode; and
   receiving an enable input signal generated by said skew control circuit by said skew detector, wherein said enable input enables or disables a phase detection operation of said skew detector, and wherein said enable input signal is only active during said first operating mode.

2. The method according to claim 1, wherein said skew detector comprises circuitry operable for preventing a phase detection circuit of said skew detector from entering a metastable state while said first operating mode is disabled.

3. The method according to claim 2, wherein said skew control loop circuitry comprises at least one gating circuit operable for gating at least one of said digital signals, wherein said gating circuit is arranged between at least one of said signal inputs and said phase detection circuit.

4. The method according to claim 1, wherein said skew detector comprises a flip flop.

5. The method according to claim 1, wherein said phase difference between said digital signals is measured over a predefined set of cycles.

6. The method according to claim 5, wherein said predefined set of cycles comprises 16 cycles.

7. The method according to claim 5, wherein said skew detector comprises circuitry operable for preventing a phase detection circuit of said skew detector from entering a metastable state while said first operating mode is disabled, and wherein a determination of being in said metastable state is based on a predefined number of alternative states in said predefined set of cycles.

8. The method according to claim 1, wherein said digital signals are clock signals.

* * * * *